United States Patent
Lappoehn (10) Patent No.: US 10,756,487 B2
(45) Date of Patent: *Aug. 25, 2020

(54) PLUG CONTACT SET AND METHOD FOR CHECKING AN ENGAGEMENT OF THE PLUG CONTACT SET

(71) Applicant: ERNI Production GmbH & Co. KG, Adelberg (DE)

(72) Inventor: Juergen Lappoehn, Gammelshausen (DE)

(73) Assignee: ERNI PRODUCTION GMBH & CO. KG, Adelberg (DE)

(*) Notice: Subject to any disclaimer, the term of this patent is extended or adjusted under 35 U.S.C. 154(b) by 146 days.

This patent is subject to a terminal disclaimer.

(21) Appl. No.: 16/094,234

(22) PCT Filed: Mar. 22, 2017

(86) PCT No.: PCT/DE2017/100228
§ 371 (c)(1),
(2) Date: Oct. 17, 2018

(87) PCT Pub. No.: WO2017/182020
PCT Pub. Date: Oct. 26, 2017

(65) Prior Publication Data
US 2019/0115696 A1 Apr. 18, 2019

(30) Foreign Application Priority Data

Apr. 18, 2016 (DE) .................. 10 2016 107 169

(51) Int. Cl.
*H01R 13/641* (2006.01)
*H01R 13/627* (2006.01)
(Continued)

(52) U.S. Cl.
CPC .......... *H01R 13/641* (2013.01); *G01R 31/68* (2020.01); *H01R 13/629* (2013.01); *H01R 13/6273* (2013.01); *H01R 2201/20* (2013.01)

(58) Field of Classification Search
CPC .. H01R 13/641; H01R 13/629; H01R 13/6273; H01R 2201/20; G01R 31/68
See application file for complete search history.

(56) References Cited

U.S. PATENT DOCUMENTS 4,084,875 A 4/1978 Yamamoto
4,915,648 A 4/1990 Takase et al.
(Continued)

FOREIGN PATENT DOCUMENTS

CN 102246361 A 11/2011
CN 102522659 B 9/2013
(Continued)

OTHER PUBLICATIONS

English translation of Taiwanese Office Action in Taiwanese Application No. 106112888 dated Feb. 11, 2020.
(Continued)

*Primary Examiner* — Alvaro E Fortich
*Assistant Examiner* — Zannatul Ferdous
(74) *Attorney, Agent, or Firm* — Collard & Roe, P.C.

(57) ABSTRACT

A plug contact set, comprising a plug contact strip (10) having several first plug contacts (12, 14) arranged in a first housing (11), at least one of which is formed as a checking contact (14) having a shorter length than the rest of the plug contacts (12), and having a plug connector (20) having several second plug contacts (22) arranged in a second housing (21), at least one of which is configured to come into electrical contact with the checking contact (14), wherein the first housing (11) has at least one first latch element (31) and the second housing (21) has at least one second latch
(Continued)

element (32) which are configured to latch together when the first plug contacts (12) are completely contacted with the second plug contacts (22), is characterised in that the second housing (21) has a third latch element (33) which can be latched with the first latch element (31) and which is arranged to be spaced apart from the second latch element (32) in the plugging direction (S) in such a way that, by latching the third latch element (33) with the first latch element (31), an as clearance-free as possible fixing of the second housing part (21) on the first housing part (11) in the completely contacted state of the first and second plug contacts (12, 14; 14) is achieved.

13 Claims, 5 Drawing Sheets

(51) Int. Cl.
*H01R 13/629* (2006.01)
*G01R 31/04* (2006.01)
*G01R 31/68* (2020.01)

(56) References Cited

U.S. PATENT DOCUMENTS

| | | | |
|---|---|---|---|
| 4,927,382 A | 5/1990 | Huber | |
| 5,655,916 A | 8/1997 | Hayashi | |
| 7,223,113 B2 | 5/2007 | Nakamura | |
| 7,811,115 B1 | 10/2010 | Tyler | |
| 2004/0192092 A1 | 9/2004 | Borrego Bel et al. | |
| 2007/0001279 A1* | 1/2007 | Nishizawa | H01R 12/721 257/679 |
| 2015/0255905 A1* | 9/2015 | Little | H01R 9/038 439/78 |
| 2015/0255939 A1* | 9/2015 | Myer | H01R 31/06 439/655 |
| 2016/0118739 A1* | 4/2016 | Tomine | B60R 16/0215 439/660 |
| 2016/0118742 A1* | 4/2016 | Akagi | H01R 13/518 439/660 |

FOREIGN PATENT DOCUMENTS

| | | |
|---|---|---|
| DE | 715 152 C | 12/1941 |
| DE | 39 06 667 A1 | 9/1989 |
| DE | 694 09 153 T2 | 7/1998 |
| DE | 10 2006 035 654 A1 | 3/2007 |
| EP | 0 314 949 A1 | 5/1989 |
| EP | 0 622 870 A2 | 11/1994 |
| JP | H04-127982 U | 11/1992 |
| TW | M376985 U | 3/2010 |
| TW | 201338292 A | 9/2013 |
| TW | I459652 B | 2/2020 |

OTHER PUBLICATIONS

European Office Action with English translation of relevant parts in EP 17 718 013.0-1205, dated Oct. 14, 2019.
English translation of Chinese Office Action in CN 201780024240.7, dated Aug. 27, 2019.
English translation of the International Preliminary Report on Patentability and Written Opinion of the International Searching Authority in PCT/DE2017/100228, dated Nov. 1, 2018.
International Search Report of PCT/DE2017/100228, dated Jun. 6, 2017.
German Search Report in German Application No. 10 2016 107 169.2 dated Nov. 26, 2018 with English Translation of relevant parts.
Canadian Office Action in Canadian Application No. 3,021,384 dated Oct. 18, 2019.
Singapore Written Opinion in Singapore Application No. 11201809182S dated Jul. 25, 2019.
Written Opinion in Singapore Application No. 112018091825 dated Apr. 21, 2020.

* cited by examiner

PLUG CONTACT SET AND METHOD FOR CHECKING AN ENGAGEMENT OF THE PLUG CONTACT SET

CROSS REFERENCE TO RELATED APPLICATIONS

This application is the National Stage of PCT/DE2017/100228 filed on Mar. 22, 2017, which claims priority under 35 U.S.C. § 119 of German Application No. 10 2016 107 169.2 filed on Apr. 18, 2016, the disclosure of which is incorporated by reference. The international application under PCT article 21(2) was not published in English.

The present invention relates to a plug contact set comprising a plug contact strip having several first plug contacts arranged in a first housing and a plug connector having several second plug contacts arranged in a second housing. The invention also relates to a method for checking a latching of at least one latch element of the plug contact strip with at least one latch element of the plug connector.

PRIOR ART

In modern motor vehicles, electrical connections are made to a large extent by plug contact sets which have a plug contact strip, into which a plug connector is inserted. During the operation of the vehicle, such plug connections are subject to considerable loads, for example shaking loads, vibrational loads and similar. Because of these loads, it can result in the plug connector dislodging from the plug contact strip and thus in a loss of electric. In order to prevent this, the housings of the plug contact strips and the plug connectors are provided with latch elements. During the assembly of the plug connectors, these latch elements are latched together in order to establish a connection between the plug contact strip and plug connectors which cannot be detached by loads occurring in the motor vehicle.

Because of assembly errors, it can result in a so-called half-plugging of a plug connector into a plug contact strip. Here, an electric contact between the plug contacts of the plug contact strip and plug contacts of the plug connector is indeed produced, however no engagement of the latch elements takes place. Because of a spatially close arrangement of plug contact sets in motor vehicles, such a half-plugging is generally not visually recognisable. A half-plugging can also not be detected by measuring the current flow between plug contact strip and plug connector since there is an electric contact between plug connector and plug contact strip that is not able to be distinguished from the desired complete plugging. A loss of the electric contacting between plug connector and plug contact strip can only emerge during operation of the motor vehicle which is indeed detected by the On-Board Diagnostics (OBD) of the motor vehicle, however can only be rectified in a workshop. In order to be able to detect such a half-plugging, it has now been proposed to form at least one plug contact as a so-called checking contact with a smaller length than the rest of the plug contacts. This checking contact occurs only in electric contact with a corresponding plug contact in the plug connector when a complete plugging, i.e. a complete plugging between the plug connector and plug contact strip, has taken place. In order to ensure this complete plugging, even over long periods of time, first and second latch elements are provided that are latched to one another when such a complete plugging has taken place. Such a plug contact set emerges, for example, from EP 0 314 949 A1. The proper plugging is thus determined by checking whether an energisation of the checking contact or the corresponding plug contact in the plug contact strip can be detected in the corresponding contact of the counterpart, i.e. the plug connector or the plug contact strip. Only when a current flow is able to be detected, a proper plugging can be assumed.

These plug contact sets have a longitudinal clearance of about 0.9 mm to 1.00 mm. At the start of plugging, i.e. when exploiting the maximum longitudinal clearance, the plug connector and the plug contact strip are latched to each other by the first and second latch elements and indeed all plug contacts are contacted electrically conductive, but not the checking contact. The longitudinal clearance is required in order to compensate the tolerances of the blade contact element and the spring contact element that form the checking contact. During assembly, the plug connectors are pushed onto the contact strips. In doing so it is necessary that the plug connectors be pushed up to the base of the plug contact strip. In this case, all plug contacts and also the checking contact are electrically correctly contacted. In the present case, by the term electrically "correctly contacted", not only an accidental touch of the two contact elements, for example the tip of a blade contact element and the spring contact element, is to be understood, but a complete contacting, for example by the blade contact elements moving completely into the spring contact elements. Now, it can occur during assembly that a plug connector within the longitudinal clearance is again somewhat dislodged from the plug contact strip because, for example, the cables that lead to the plug connectors have been pulled on, or similar. This can also still occur after a proper plugging of the plug connector. When the plug connector has thus been dislodged so far from the plug contact strip that the longitudinal clearance has been used fully, it then occurs that the checking contact of the plug connector is no longer electrically conductively connected to the corresponding plug contacts of the plug contact strip. In this case, a defect described above is signalised that is labelled as a so-called pseudo error during production. They are called "pseudo errors" because there is in fact no error present, since the plug contacts, i.e. the utility contacts, in this case are all correctly contacted, with the exception of the checking contact. During assembly, this is indeed determined as an error. Such an error is thus particularly disruptive and disadvantageous because, even when visually inspecting the plug contact set, a proper plugging is able to be detected since the latch elements are indeed latched to one another. Such an erroneous contacting is particularly disruptive during assembly since, during the assembly process, erroneous contacting are signalled that delay the assembly process.

DISCLOSURE OF THE INVENTION

According to the invention, for the plug contact set, it is thus provided for the second housing to have a third latch element which can be latched with the first latch element and which is arranged to be spaced apart from the second latch element in the plugging direction in such a way that as clearance-free as possible fixing of the second housing part on the first housing part in the completely contacted state of the first and second plug contacts is achieved by latching the third latch element with the first latch element.

During the assembly process, a secure contacting of the checking contact with the corresponding plug contact is ensured by this third latch element which is also able to be latched to the first latch element and which enables a fixing of the second housing part into the first housing part that is as clearance-free as possible on the circuit board in the completely contacted state of the first and second plug contacts by the engagement, and thus error reports are avoided because of the previously mentioned clearance which can lead to a non-contacting of the checking contact. Furthermore, dislodging the second housing part from the first housing part, i.e. dislodging the direct plug connector from the plug contact strip during the operation of, for example, a vehicle is effectively prevented. It is further ensured by this third latch element that the plug connector is completely plugged into the plug contact strip and remains in this state. "Readjusting" the plug connector in this way is no longer necessary. Such a readjustment is, for example, then always necessary in plug connectors known from prior art when a current interruption is detected on the checking contact. The first and simple way of checking whether a defect is present is then to once again press the plug connector a little harder into the plug contact strip, which must be carried out by the assembler during assembly. Such an additional assembly process can be very disadvantageous, in particular with many plug connectors to be assembled. By the solution according to the invention it is possible that, when latching the third latch element into the first latch element, it is ensured that a complete plugging of the plug contacts is present and the first and the second housing are connected to each other in such a way that even shaking loads and other mechanical loads cannot lead to a de-contacting of the plug contacts.

In a first exemplary embodiment, two respective first latch elements arranged on opposite side walls of the first housing and two respective second and third latch elements arranged on opposite side walls of the second housing are provided. This formation of the latch elements on opposite side walls ensures a parallel and even plugging of the plug connector into the plug contact strip and thus complete contact of the plug contacts.

Purely in principle, the latch elements can be formed in different ways. According to an advantageous embodiment, it is provided that the at least one first latch element is a latch opening and that the at least one second latch element and the at least one third latch element are latch noses adjusted to the latch opening. This configuration of the latch elements can be produced in a simple manner and at the same time allows a very good latching of the two housing parts to each other.

In this case, it is advantageously provided that the third latch element rests against a wall which delimits the latch opening while exerting a preload. This preload makes it possible to fix the two housing parts of the plug connector and the plug contact strip to each other in such a way as to withstand mechanical loads and, in particular, vibrational loads.

Purely in principle, in particular with very long plug contact strips having very many plug contacts, more than one checking contact could be provided. One advantageous embodiment provides precisely one checking contact. Even with one checking contact, a proper plugging can be examined. The remaining plug contacts can thus be available for other purposes.

It is preferably provided that this checking contact is arranged centrally in the contact strip. It is, in turn, determined by this arrangement whether an even plugging, i.e. a plugging that in particular is not tilted or slanting, but rather parallel, of the plug connector into the contact strip has been carried out. Only in this case does no current interruption occur.

The checking contact has—as already mentioned above—a smaller length than the other plug contacts in the plug contact strip. The remaining plug contacts, in comparison, have substantially the same length.

Thus, the checking contact is formed to be so short that it does not come into electric contact with a second plug contact when the at least one first latch element is not latched to the at least one second latch element. In doing so it is determined whether the plug has been properly plugged. The plug contact set advantageously has three latch points, a first latch point, a second latch point and a third latch point. The at least one first latch element is latched in all three latch points with the at least one second latch element and thus the first latch point is chosen in such a way that a second plug contact does not electrically contact the checking contact. In the second latch point, at least one second plug contact electrically contacts the checking contact and in the third latch point, all first and second plug contacts are in contact with one another and the two housing parts are fixed to each other. The second latch point is therefore the latch point that usually represents a proper plugging. The third latch point corresponds to the second latch point, however here it is absolutely ensured that all plug contacts are contacted with one another and the two housing parts are fixed to be virtually clearance-free.

This embodiment of the plug contact set according to the invention enables two methods for checking a latching of the at least one latch element to the at least one second latch element and to the at least one third latch element. There can hereby be differentiation between whether the plug contact strip is latched to the plug connector in the desired manner or whether a half-plugging without latching is present that can be additionally caused because of shaking loads or other mechanical loads.

In one embodiment of the method according to the invention, a latching of the at least one first latch element to the at least one second and third latch element is checked by the checking contact being energised and checking whether a current is flowing between the checking contact and a second plug contact. If such a current flow is detected, it is determined that a latching is present. Thus, either the checking contact or the second plug contact that is set up in order to electrically contact the checking contact can be energised.

BRIEF DESCRIPTION OF THE DRAWINGS

An exemplary embodiment of the invention is illustrated in the drawings and explained in more detail in the following description.

EXEMPLARY EMBODIMENTS OF THE INVENTION

Figure 1:
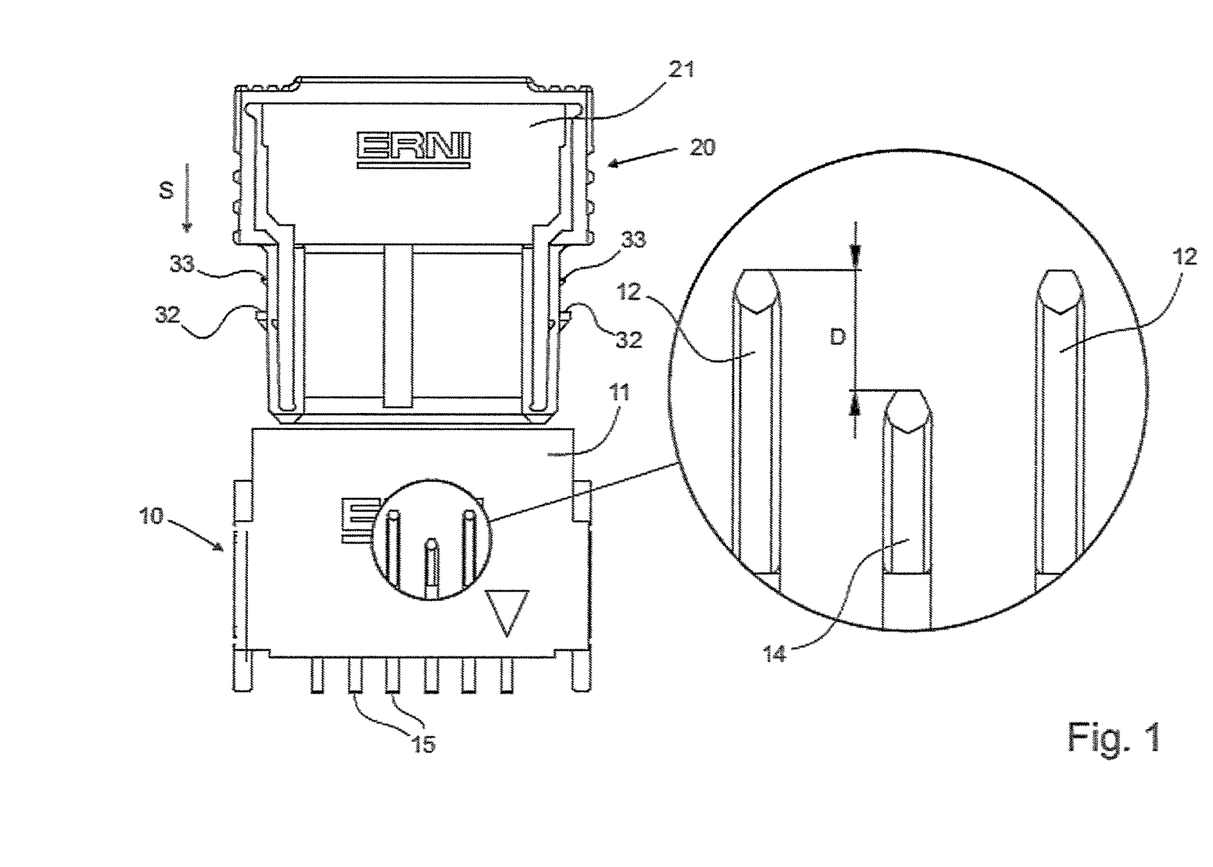
FIG. 1 shows a schematic illustration of a plug contact set according to the invention in the non-plugged state with a sectional enlargement of the plug contacts respectively of the checking contact.
Figure 2:
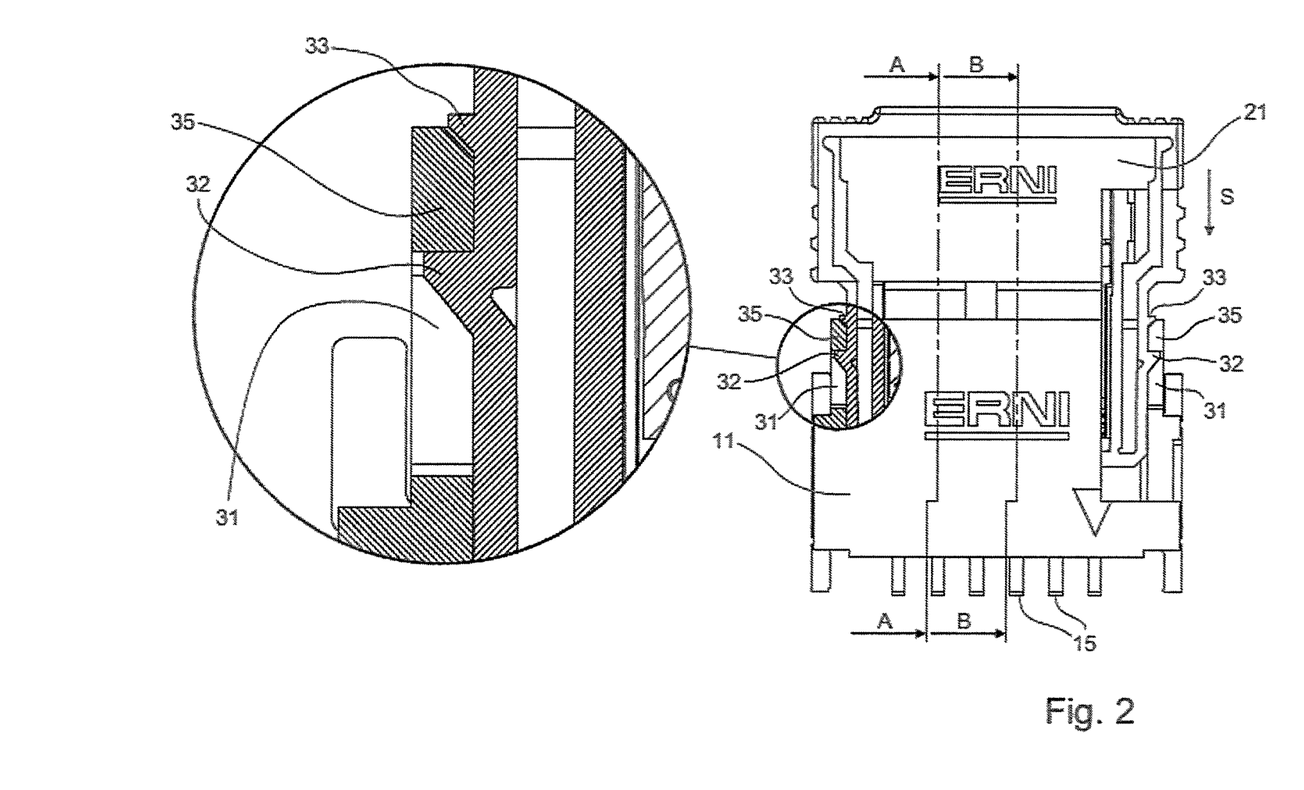
FIG. 2 shows the plug contact set shown in FIG. 1 in the plugged state with a sectional enlargement of the latch elements.
Figure 3:
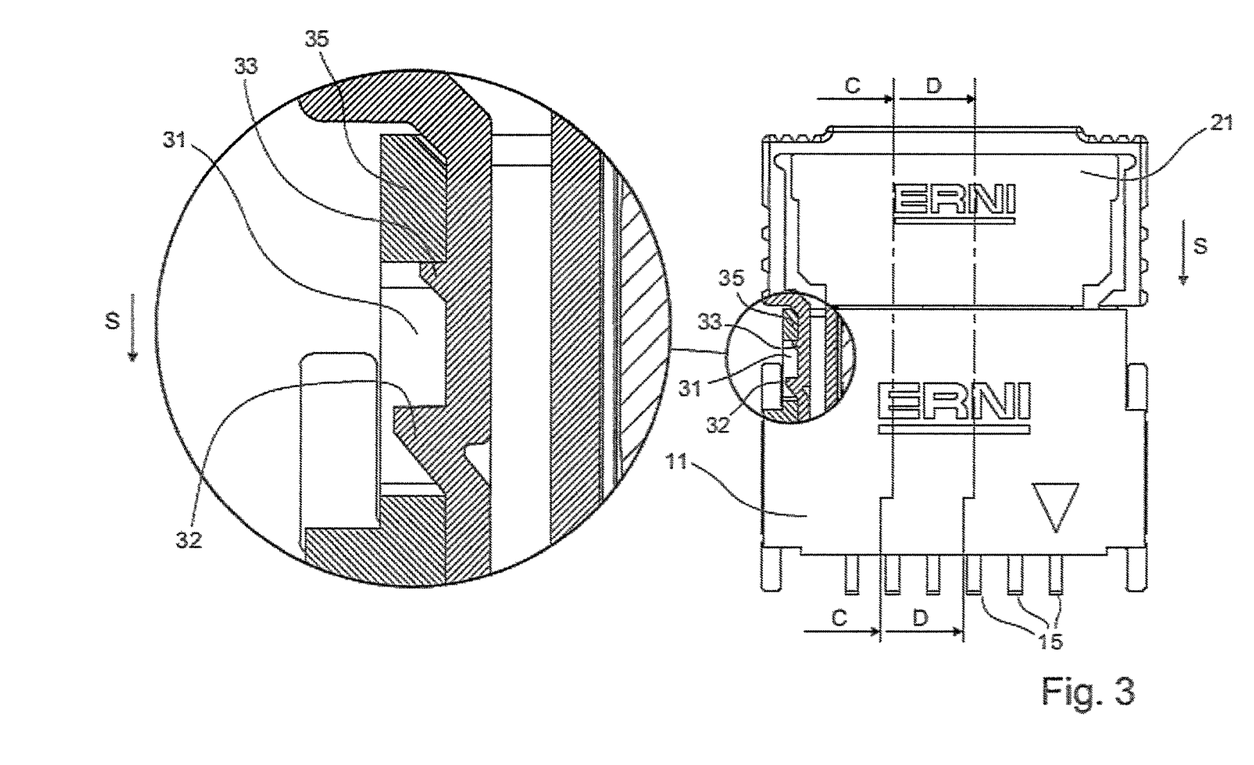
FIG. 3 shows the plug contact set illustrated in FIGS. 1 and 2 in the completely latched state with a sectional enlargement of the latch elements.
Figure 4A:
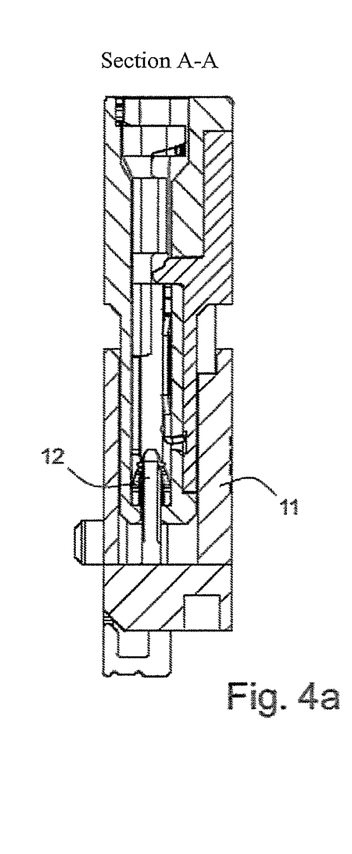
FIG. 4a) shows a sectional view along the line A-A in FIG. 2.
Figure 4B:
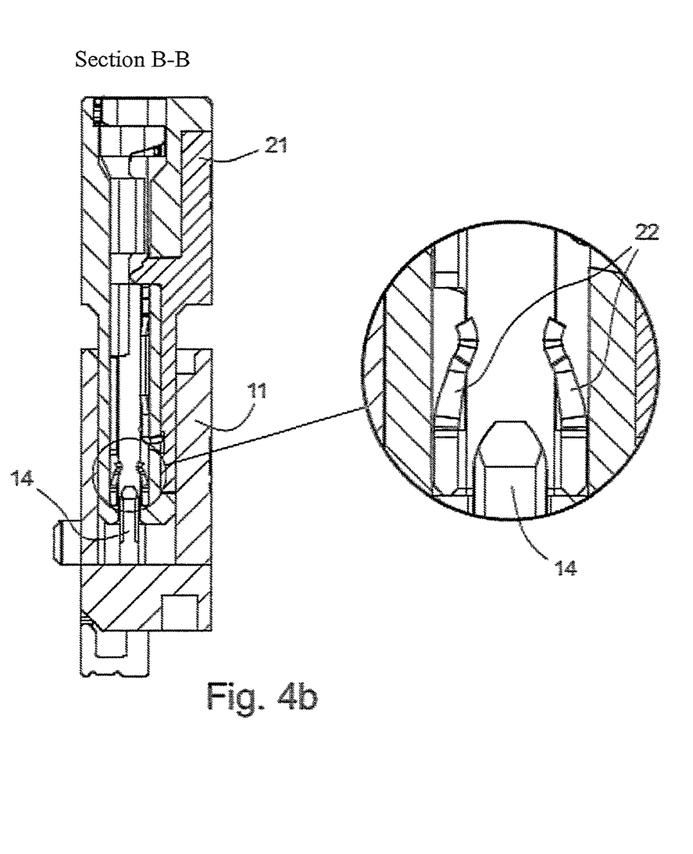
FIG. 4b) shows a sectional view along the line B-B in FIG. 2 with a sectional enlargement of the checking contact.
Figure 4C:
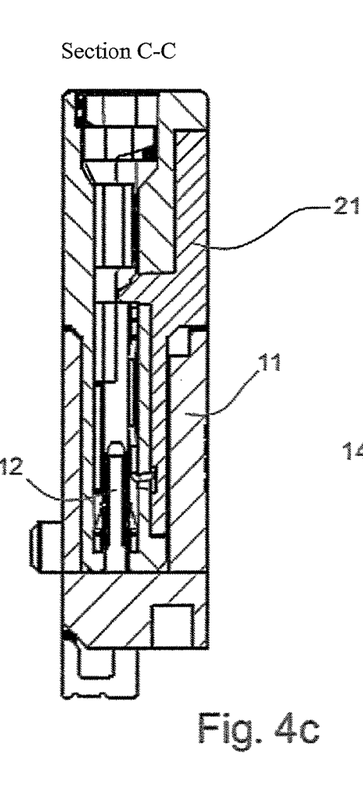
FIG. 4c) shows a sectional view along the line C-C in FIG. 3.
Figure 4D:
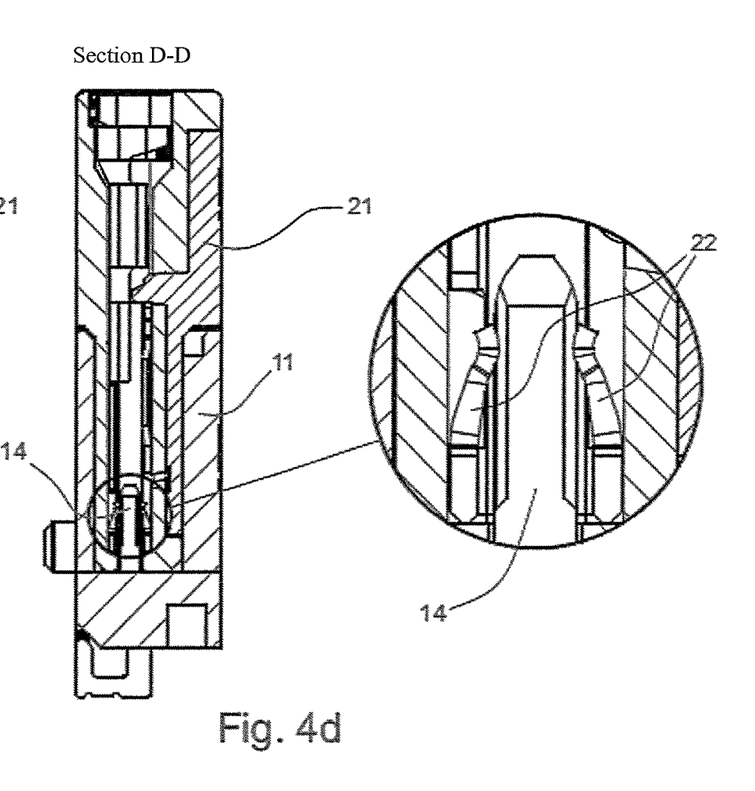
FIG. 4d) shows a sectional view along the line D-D in FIG. 3 with a sectional enlargement of the checking contact in the plugged state.

FIGS. 1, 2 and 3 each show a plug contact set in different states of plugging. The plug contact set comprises a plug contact strip 10 and a plug connector 20 which can be plugged into each other. The plug contact strip 10 has a first housing 11, the plug connector 20 has a second housing 21. In the first housing 11, a plurality of first plug contacts 12 of substantially the same length are arranged in a known manner side by side in the form of one or more rows. A first plug contact 14 is formed to be shorter by a length A, as shown in the sectional enlargement in FIG. 1. This shorter plug contact 14 is a checking contact. All plug contacts have connection pins 15 on their side which faces away from the plug side and faces towards a printed circuit board (not shown). In the second housing 21, known spring contact elements are likewise arranged side by side in one or more rows, which are adapted to the blade contacts 12, 14. Such spring contacts 22 are shown in FIGS. 4a to 4d. In the plugged-together state of the plug connector 20 in the plug contact strip 10, all the blade contacts 12, 14 are electrically contacted by all spring contacts 22. In order to determine whether there is correct plugging, the checking contact 14 or alternatively the blade contact corresponding to the checking contact 14 is energised and it is determined whether a current flow is present from the checking contact 14 to the corresponding spring contact 22 or vice versa from the corresponding spring contact 22 to the checking contact 14. If this is the case, a correct plugging is assumed. If this is not the case, there is a contact interruption between the checking contact 14 and the corresponding second plug contact in the form of a spring contact 22. In this case, a half-plugging or incorrect plugging must be assumed. Such an incorrect plugging or half-plugging can be referred to as the first latch point. At a second latch point, a full plugging is achieved. In this case, a second latch element 32 is latched with a first latch element 31. The second latch element 32 can, as shown in the sectional enlargements in FIGS. 2 and 3, be a latch nose, for example, which is arranged in a corresponding latch opening 31. In this case, the second latch element 32 rests against a wall of a web 35 which delimits the latch opening 31 and is arranged on the plug contact strip 10. This is illustrated in a cross-sectional view in the sectional enlargement in FIG. 2. It is now provided that the latch opening 31 allows a certain clearance in the plugging direction S, which is achieved by the latch opening 31 having a certain length in the plugging direction S, which enables the second latch element 32, i.e. the latch nose, to move in and against the plugging direction S. This clearance is approximately 0.9 mm to 1.0 mm. This is due to the operating sequence during the plugging process in connection with the checking contact. Firstly, a latching of the first and second latch elements takes place. This latching must take place by the amount mentioned, i.e. between 0.9 mm and 1.0 mm from the end position (fully plugged state), in order to ensure that all the operating contacts, i.e. all plug contacts 12, are securely engaged, except of the shorter checking contact 14 which, in this plugged position, must in no case already be in contact with the corresponding spring contact 22 in the plug connector 20, i.e. a contact spring. During assembly, the plug connector 20 is now pushed completely onto the plug contact strip 10. When the plug connector 20 is completely pushed onto the plug contact strip 10 on the ground, i.e. effectively as far as the stop, all the plug contacts 12 and also the checking contact 14 are electrically conductively connected, i.e. contacted, with the relevant corresponding spring contacts 22. During assembly, the undesirable situation may now occur that the plug connector and/or the cables which lead to the plug connector 20 are pulled in such a way that the plug connector 20 is dislodging slightly from the plug contact strip 12. The dislodging thus takes place after an initially correct plugging. It is also possible that the latch element 32 is latched in the latch opening 31 during the assembly of the plug connector 20 on the plug contact strip 10, but that the plug connector 20 is not so deeply plugged that the checking contact 14 and the relevant corresponding spring contact 22 are electrically conductively connected to each other. This plugging is detected and signalled as an error during assembly. Here, this is indeed a pseudo error that is also labelled as such since the plug contacts 12 of the plug contact strip 10 and the plug connector 20 are correctly contacted—except for the checking contact 14. During assembly, a non-contacting of the checking contact 14 is, however, recognised as an error. In this case, the assembler would have to press the plug connector 20 again completely into the plug contact strip 10 by exerting a corresponding pressure in the plugging direction S. It is obvious that, in particular with a very large number of such plug contact sets, as are installed in vehicles, for example, such an "readjusting" is a waste of time and not desirable for the assembly of vehicles on the assembly line.

In order to avoid this, the invention provides a third latch element 33 in the form of a further latch nose. In the completely plugged state, that is to say when the plug connector 20 is completely plugged onto the base of the plug contact strip 10 and all the plug contacts 12, 14, 22 are electrically connected to one another, the third latch element 33 engages with the latch opening 31, i.e. in the first latch element, and rests against the wall of the web 35 delimiting the opening 31 so that the two housing parts 11, 21 are fixed to each other as clearance-free as possible. This state is illustrated in FIG. 3 and, in particular, in the sectional enlargement.

The third latch element 33 thus enables a fixing in the completely plugged state, i.e. at a third latch point that differs from the second latch point, which is illustrated in FIG. 2, in that, during assembly, it is ensured that the plug contact sets are completely plugged, which can be recognised by detecting a plugged checking contact 14. In this case, the two housing parts are fixed to each other in such a way that even a shaking load or another mechanical load, for example a vibrational load or the like, does not allow the plug connector 20 to be released from the plug contact strip 10.

A proper plugging can be determined by either energising the checking contact 14 or its corresponding spring contact 22 in the plug connector 20. Here it is checked whether a current is flowing between the checking contact 14 and the corresponding plug contact 22. If this is not the case, then there is no proper plugging present.

This enables an automatic checking of the plug contact set according to the invention for the presence of a half-plugging, for example, or an improper plugging. If this is detected, then the half-plugging or the improper plugging can still be corrected during the assembly process.

The invention claimed is:

1. A plug contact set, comprising a plug contact strip (10) having several first plug contacts (12, 14) arranged in a first housing part (11), at least one of which is formed as a checking contact (14) having a shorter length than the rest of the first plug contacts (12), and having a plug connecter (20) having several second plug contacts (22) arranged in a second housing part (21), at least one of which is configured to come into electrical contact with the checking contact (14), wherein the first housing part (11) has at least one first latch element (31) and the second housing part (21) has at least one second latch element (32), which are configured to latch together when the first plug contacts (12) are completely contacted by the second plug contacts (22), the second housing part (21) has a third latch element (33) which can be latched with the first latch element (31) and is arranged to be spaced apart from the second latch element (32) in the plugging direction (S) in such a way that, by latching the third latch element (33) with the first latch element (31), an as clearance-free as possible fixing of the second housing part (21) on the first housing part (11) in a completely contacted state of the first and second plug contacts (12, 14; 22) is achieved.

2. The plug contact set according to claim 1, wherein two respective first latch elements (31) arranged on opposite side walls of the first housing part (11) and two respective second and third latch elements (32, 33) arranged on opposite side walls of the second housing part (21) are provided.

3. The plug contact set according to claim 1, wherein the at least one first latch element is a latch opening (31) and the at least one second latch element (32) and the at least one third latch element (33) are latch noses adapted to the latch opening (31).

4. The plug contact set according to claim 3, wherein the third latch element (33) rests against a wall which delimits the latch opening (31) as clearance-free as possible.

5. The plug contact set according to claim 1, wherein the plug contact strip (10) has exactly one checking contact (14).

6. The plug contact set according to claim 5, wherein the checking contact (14) is arranged centrally in the plug contact strip (10).

7. The plug contact set according to claim 5, wherein all remaining first plug contacts (12) have the same length.

8. The plug contact set according to claim 1, wherein the second plug contacts (22) are all of the same length.

9. The plug contact set according to claim 1, wherein the checking contact (14) is formed to be so short that it does not come into electrical contact with a second plug contact (22) when the at least one first latch element (31) is not latched with the at least one second latch element (32).

10. The plug contact set according to claim 1, wherein it has a first latch point, a second latch point and a third latch point, wherein the at least one first latch element (31) is latched to the at least one second latch element (32) at all three latch points and wherein, in the first latch point, no second plug contact (22) comes into electrical contact with a checking contact (14), in the second latch point, at least one second plug contact (22) comes into electrical contact with a checking contact (14) and, in the third latch point, all first and second plug contacts (12, 14; 22) have come into contact with one another and the first housing part and the second housing part (11, 21) are fixed to one other.

11. The plug contact set according to claim 1, wherein the first plug contacts (12) are blade contact elements and the second plug contacts (22) are spring contact elements.

12. A method for checking a latching of the at least one first latch element (31) with the at least one second and third latch element (32, 33) of the plug contact set according to claim 1, comprising
    energizing a checking contact (14)
    checking whether a current flows between the checking contact (14) and a second plug contact (22), and
    determining that a latching is present when a current flow has been detected.

13. A method for checking a latching of the at least one first latch element (31) with the at least one second and third latch element (32, 33) of the plug contact set according to claim 1, comprising
    energizing a second plug contact (22) which is configured to come into electrical contact with a checking contact (14),
    checking whether a current flows between the checking contact (14) and this second plug contact (22), and
    determining that a latching is present when a current flow has been detected.

\* \* \* \* \*